United States Patent
Terryn et al.

(10) Patent No.: US 9,344,655 B2
(45) Date of Patent: May 17, 2016

(54) ACTIVE PIXEL SENSOR IMAGING SYSTEM

(71) Applicant: IMEC VZW, Leuven (BE)

(72) Inventors: Steven Terryn, Denderleeuw (BE); Mandar Thite, Pune (IN)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/754,394

(22) Filed: Jun. 29, 2015

(65) Prior Publication Data

US 2015/0381914 A1 Dec. 31, 2015

(30) Foreign Application Priority Data

Jun. 30, 2014 (EP) .................................... 14174985

(51) Int. Cl.
  *H04N 5/369* (2011.01)
  *H04N 5/374* (2011.01)
  *H03F 3/50* (2006.01)
  *H04N 5/378* (2011.01)
  *H03F 3/08* (2006.01)

(52) U.S. Cl.
  CPC ............. *H04N 5/3698* (2013.01); *H03F 3/085* (2013.01); *H03F 3/505* (2013.01); *H04N 5/374* (2013.01); *H04N 5/378* (2013.01); *H03F 2203/5012* (2013.01)

(58) Field of Classification Search
  CPC ..... H04N 5/3698; H04N 5/374; H04N 5/378; H03F 3/085; H03F 3/505
  See application file for complete search history.

(56) References Cited

U.S. PATENT DOCUMENTS

| 5,365,199 | A | 11/1994 | Brooks | |
|---|---|---|---|---|
| 7,768,352 | B2 * | 8/2010 | Sutardja | H03F 3/3001 330/255 |
| 7,847,846 | B1 | 12/2010 | Ignjatovic et al. | |
| 2002/0063598 | A1 * | 5/2002 | Huijsing | H03F 1/083 330/257 |
| 2006/0267685 | A1 * | 11/2006 | Alenin | H03F 1/48 330/258 |

OTHER PUBLICATIONS

Kenney, J.G. et al. "An Enhanced Slew Rate Source Follower," IEEE Journal of Solid-State Circuits, IEEE Service Center, Piscataway, NJ, USA, vol. 30, No. 2, Feb. 1, 1995, pp. 144-146.
European Search Report in European Application No. 14174985.3, dated Oct. 14, 2014.

* cited by examiner

*Primary Examiner* — Nicholas Giles
(74) *Attorney, Agent, or Firm* — Knobbe, Martens, Olson & Bear, LLP

(57) ABSTRACT

An active pixel sensor imaging system is disclosed. In one aspect, the system includes a plurality of active pixel sensor circuits arranged into an array of rows and columns. Each active pixel sensor is connected to a supply line and a column line, and operable to generate a voltage output through the column line corresponding to a detected light intensity. The system includes a current sensing circuit, located external to the plurality of active pixel sensor circuits and connected to the supply line. The current sensing circuit is implemented as a current mirror for sensing a current through an active pixel sensor circuit readout transistor. The system includes a feedback circuit, located external to the plurality of active pixel sensor circuits and connected to the column line, to a current generator and to the current sensing circuit. The feedback circuit is implemented as a class AB current mirror configured for controlled quiescent current.

11 Claims, 6 Drawing Sheets

ACTIVE PIXEL SENSOR IMAGING SYSTEM

RELATED APPLICATIONS

This application claims priority to European Application No. 14174985.3, filed on Jun. 30, 2014, entitled "ACTIVE PIXEL SENSOR IMAGING SYSTEM", which is incorporated herein by reference in its entirety.

BACKGROUND

1. Technological Field

The disclosed technology relates generally to image sensors and more specifically to active pixel sensor imaging systems.

2. Description of the Related Technology

Conventional four-transistor active pixel sensors (APS) have configurations in which a source-follower drives the signal onto a readout column line that is shared amongst all the pixel sensors in that column. In the case of large imagers with large pixel size and/or a large number of pixels, parasitics associated with readout column lines may become considerable, with capacitances up to 10 pF, slowing high-speed image sensor readout as the settling time of column line signal becomes a bottleneck. A solution to increase the readout speed is increasing the biasing current of the column line this approach increases power consumption and increases the voltage drop over the large column line resistance, thus decreasing voltage headroom.

U.S. Pat. No. 7,847,846 B1 discloses an active pixel sensor that employs readout transistor current sensing and feedback circuits to increase current driving capabilities and readout speed. The current through the in-pixel readout transistor is sensed by a circuit that is external to the pixel, and according to the measured current value a feedback current is supplied to charge the read-line parasitic capacitance. The feedback current is supplied by a circuit that also is external to the pixel area.

There is a need to improve current state of the art active pixel sensor imaging systems in order to reduce power consumption and/or settling time and/or a trade-off thereof.

SUMMARY OF CERTAIN INVENTIVE ASPECTS

The disclosed technology includes an active pixel sensor imaging system.

In some aspect, the APS imaging system is capable of reducing overall settling time, and particularly the downwards settling time. In an embodiment, the APS imaging system is capable of reducing settling time without increasing power consumption compared to conventional APS imaging systems with simple source-follower configuration. In an embodiment, the APS imaging system presents less implementation complexity, less power consumption and/or greater stability than state of the art APS designs.

In an embodiment, a current sensing active-pixel architecture configured for pixel readout operation provides a closed loop circuit around the basic pixel configuration that can provide higher bandwidth than a simpler source-follower.

One aspect is an active pixel sensor imaging system. The system includes a plurality of active pixel sensor circuits arranged into an array of rows and columns. Each or at least one of the active pixel sensor circuits is connected to a supply line and a column line and operable to generate a voltage output through the column line corresponding to a detected light intensity. The system includes a current sensing circuit, located external to the plurality of active pixel sensor circuits and connected to the supply line. The current sensing circuit is implemented as a current mirror for sensing a current through an active pixel sensor circuit readout transistor. The system includes a feedback circuit, located external to the plurality of active pixel sensor circuits and connected to the column line, to a current generator and to the current sensing circuit. The feedback circuit is implemented as a classAB current mirror configured for controlled quiescent current.

With state-of-the art implementations, the settling time of the column line signal is highly asymmetric, where upwards settling time is exponential and downwards settling time is to a large extent linear due to slew-rate limitation by the current source. According to an exemplary embodiment, an active pixel sensor imaging system of the present disclosure improves the settling time, especially for the downward settling, without sacrificing on power consumption. By adding an actively controlled current source instead of pure static biasing, the circuit is turned into a classAB-operation that can provide an order-of-magnitude higher dynamic current compared to the static current, thus solving the slew-rate limitation.

In an embodiment, a feedback circuit is designed to present a different current gain for a rising and a falling slope of the column line output voltage.

In an embodiment, the feedback circuit is designed to have a transfer function with two linear segments, each segment having a different slope. In an embodiment, the inflexion point between the two linear segments of the transfer function is defined by a reference current generated within the feedback circuit.

In an embodiment, the classAB current mirror comprises a push-pull current mirror stage where the ratio of a first pair of transistors determines the gain for currents above the reference current and the ratio of a second pair of transistors determines the gain for currents below the reference current. The first pair of transistors may be PMOS transistors and the second pair of transistors may be NMOS transistors.

In an embodiment, the classAB current mirror comprises a pair of transistors to control the quiescent current according to a Monticelli bias scheme. The classAB current mirror may also comprise a bypass capacitor connected between the two gate voltages of the classAB stage transistors.

In an embodiment, the current sensing circuit is implemented as a low-swing current mirror designed to reduce its input impedance at a first connection node to the supply line.

In an embodiment, the impedance at the first connection node between the supply line and the current sensing circuit is designed to be lower than a second connection node between the feedback circuit and the column line, such as to obtain a non-dominant pole at the first connection node.

Another aspect is a device including an active pixel sensor imaging system. The system includes a plurality of active pixel sensor circuits arranged into an array of rows and columns. Each or at least one of the active pixel sensor circuits is connected to a supply line and a column line and operable to generate a voltage output through the column line corresponding to a detected light intensity. The system includes a current sensing circuit, located external to the plurality of active pixel sensor circuits and connected to the supply line. The current sensing circuit is implemented as a current mirror for sensing a current through an active pixel sensor circuit readout transistor. The system includes a feedback circuit, located external to the plurality of active pixel sensor circuits and connected to the column line, to a current generator and to the current sensing circuit. The feedback circuit is implemented as a classAB current mirror configured for controlled quiescent current.

BRIEF DESCRIPTION OF THE DRAWINGS

The above and other aspects of the system according to the present description will be shown and explained with reference to the non-restrictive example embodiments described hereinafter.

DETAILED DESCRIPTION OF CERTAIN INVENTIVE ASPECTS

In the following, in the description of exemplary embodiments, various features may be grouped together in a single embodiment, figure, or description thereof for the purpose of streamlining the disclosure and aiding in the understanding of one or more of the various inventive aspects. This is however not to be interpreted as the invention requiring more features than the ones expressly recited in the main claim. Furthermore, combinations of features of different embodiments are meant to be within the scope of the invention, as would be clearly understood by those skilled in the art. Additionally, in other instances, well-known methods, structures and techniques have not been shown in detail in order not to obscure the conciseness of the description.

Figure 1:
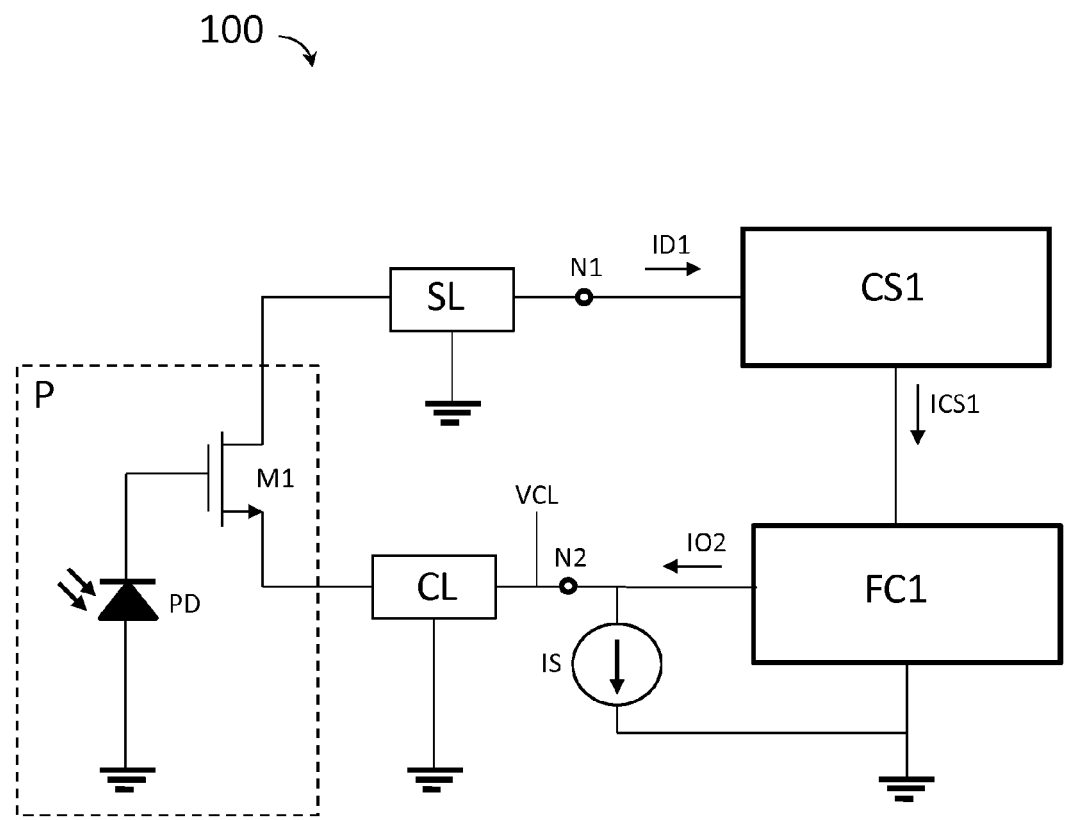
FIG. 1 is a schematic diagram of an exemplary active pixel sensor imaging system.

FIG. 1 is a schematic diagram of an exemplary active pixel sensor imaging system 100. The system 100 includes an active pixel sensor circuit P including a photodetector PD and a source-follower transistor M1. The system 100 includes a current sensing circuit CS1, a feedback circuit FC1, a current source IS, a supply line SL and a column line CL. The in-pixel source-follower transistor M1 acts as a source-follower readout transistor which connects to the out-of pixel part of the readout circuit. The drain terminal of the in-pixel source-follower transistor M1 provides a first current ID1 to the external current sensing circuit CS1 through the supply line SL. The source terminal of the in-pixel source-follower transistor M1 is connected to the external current source IS and the feedback circuit FC1 through the column line CL. The feedback circuit FC1 receives a current sensing output current ICS1 from the current sensing circuit CS1 and provides a second current IO2 to the source terminal of the in-pixel source-follower transistor M1.

According to an exemplary embodiment, the current sensing circuit CS1 and the feedback circuit FC1 are implemented as current mirrors that form a stable and controlled closed loop gain and response. The current sensing circuit CS1 and the feedback circuit FC1 form an out-of pixel readout circuitry that does not impact the structure of the plurality of APS circuits P of the imaging system since the external readout circuitry is added as an add-on at the imaging system's column level. Therefore, the proposed out-of pixel readout circuitry is independent from the actual implementation of the active pixel sensor circuit P, which may comprise three or four transistors or any other active pixel implementation. According to an exemplary embodiment, the in-pixel source-follower transistor M1 is implemented as a MOS transistor.

Figure 2:
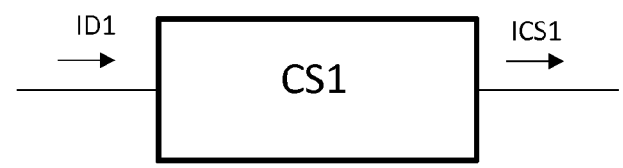
FIG. 2 is a block diagram and transfer function of an exemplary current sensing circuit.
Figure 2:
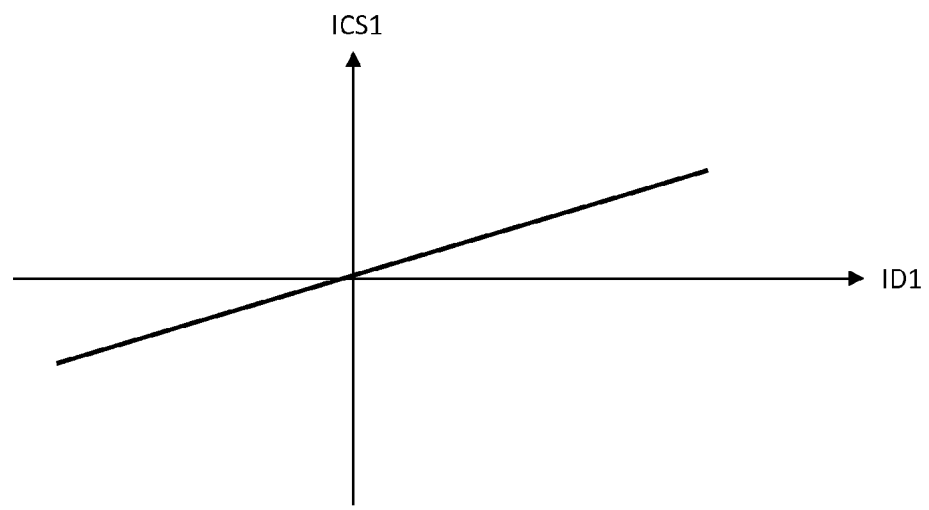

FIG. 2 is a block representation of a general current sensing circuit CS1 receiving an input current ID1 and providing an output current ICS1 and its exemplary transfer function. In an embodiment, the current sensing circuit CS1 corresponds to the current sensing circuit CS1 of FIG. 1. According to an exemplary embodiment, the current sensing circuit CS1 has a linear transfer function.

Figure 3:
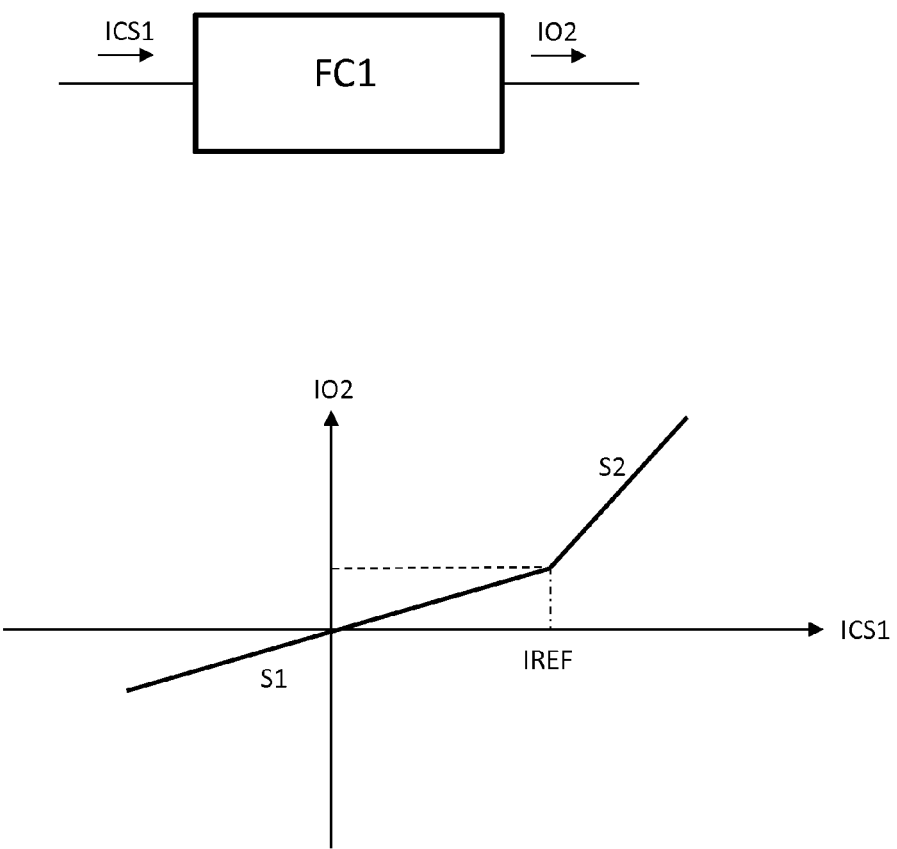
FIG. 3 is a block diagram and transfer function of an exemplary feedback circuit.

FIG. 3 is a block representation of a general feedback circuit FC1 receiving an input current ICS1 and providing an output current IO2 and its exemplary transfer function. In an embodiment, the feedback circuit FC1 corresponds to the feedback circuit FC1 of FIG. 1. According to an exemplary embodiment, the feedback circuit FC1 has a linear transfer function divided in two segments, a first linear segment S1 and a second linear segment S2, each segment having a different slope. The inflexion point of the transfer function that divides the segments is defined by a reference current IREF provided or generated within the feedback circuit FC1. The two slopes of the feedback circuit FC1 represent a different current gain for the rising and falling slope of the output voltage VCL. This allows optimization of the trade-off between maximal slew-rate (in downwards settling) and loop stability (in upwards settling).

It shall be understood that although the currents in FIG. 2 and FIG. 3 have been presented as positive currents other representations are possible in which the currents have a negative sign.

Figure 4:
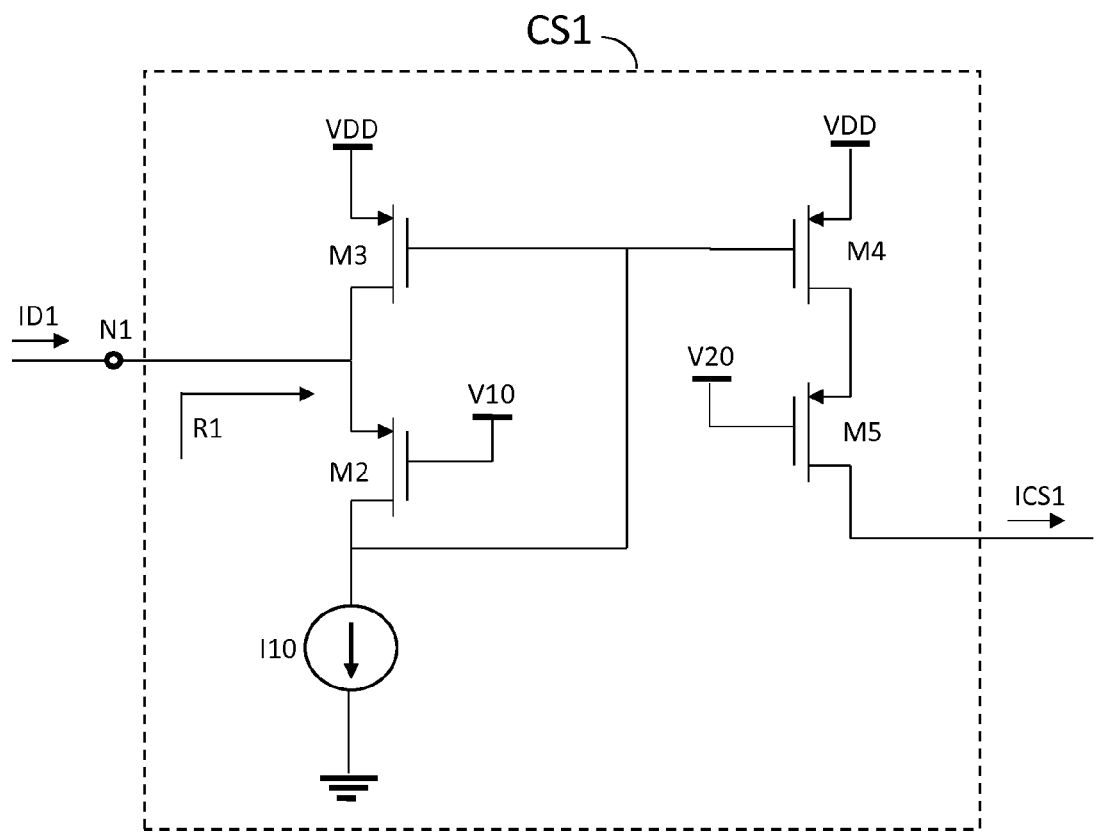
FIG. 4 is an exemplary implementation of a current sensing circuit.

FIG. 4 is an exemplary implementation of a current sensing circuit CS1 according to the present description, comprising four transistors M2 to M5 and a current source I10 which form a current mirror. In an embodiment, the current sensing circuit CS1 corresponds to the current sensing circuit CS1 of FIG. 1 and FIG. 2.

According to an exemplary embodiment, the current sensing circuit CS1 presents an input impedance to the supply line SL at a first connection node N1, which is lower than for a standard current mirror. The input impedance R1 is lowered by using a low-swing current mirror according to the current description. This increases the stability of the feedback loop. This implementation of the current mirror has the advantage that the input impedance R1 is lowered by the gain provided by transistor M2. In turn, this lowered input impedance R1 shifts the pole frequency at the first connection node N1 to higher frequencies (compared to a standard current mirror), thus allowing a higher overall gain-bandwidth of the loop, resulting in faster settling of the output voltage VCL. In general, this lowered input impedance R1 depends on the current flowing through transistor M2, provided by current source I10. In this way, the stability of the loop can be ensured by providing an adequate current through the current source I10, which is an easy, flexible and effective way to stabilize this loop.

According to an exemplary embodiment, the impedance at the first connection node N1 between the supply line SL and the current sensing circuit CS1 is designed to be lower than a second connection node N2 (in FIG. 1) between the feedback circuit and the column line CL, such as to obtain a non-dominant pole at the first connection node N1 that provides stability. According to an exemplary embodiment, the impedance at the first connection node N1 is lower than the impedance at the second connection node N2 by a factor which is from the order of magnitude from the loop gain.

The implementation of the current sensing circuit CS1 according to the present description is a current sensing mirror that presents a stable response, i.e. a process/temperatureindependent gain. Furthermore, the proposed circuit presents reduced implementation complexity and power consumption.

Figure 5:
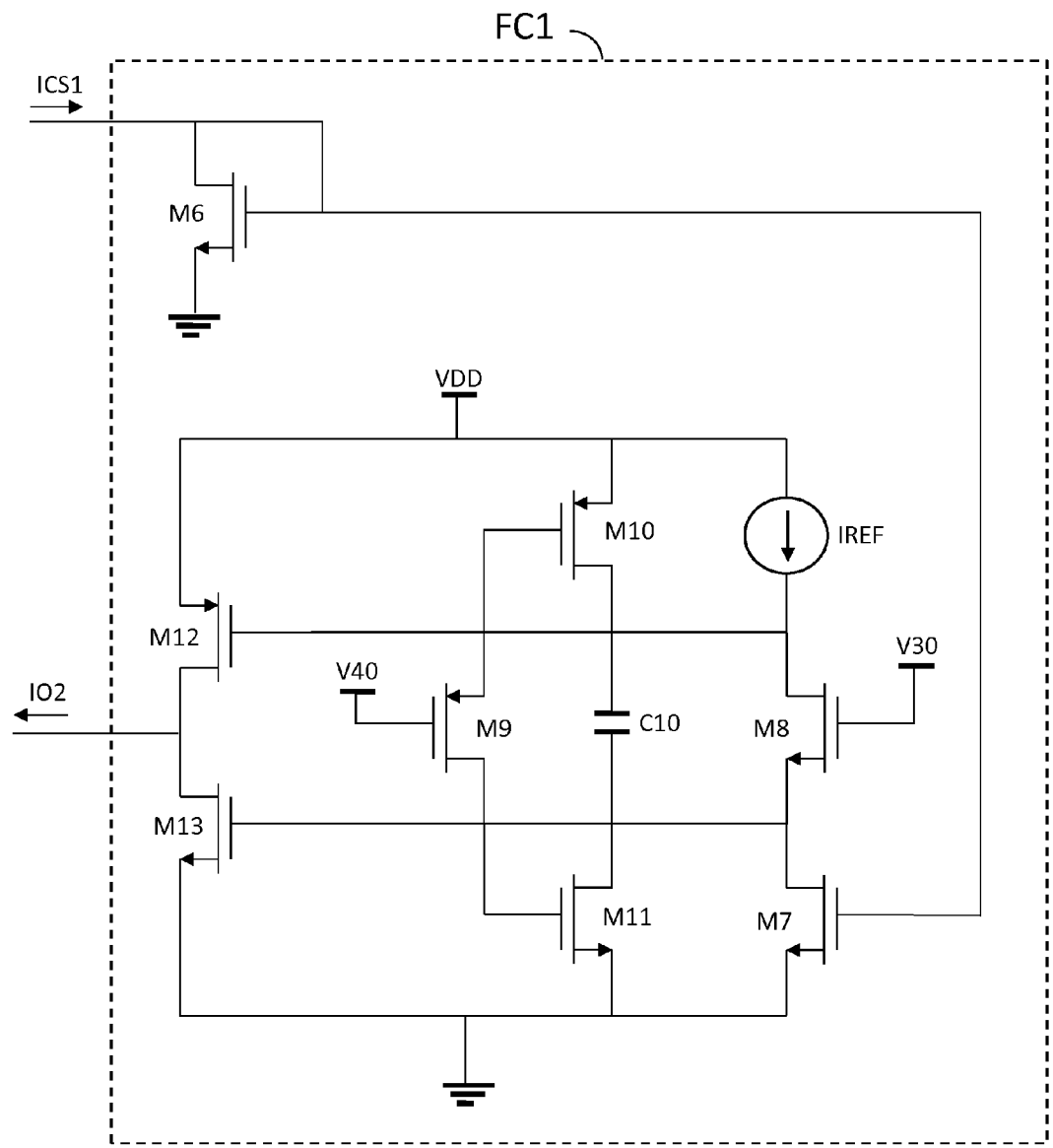
FIG. 5 is an exemplary implementation of a feedback circuit.

FIG. 5 is an exemplary implementation of a feedback circuit FC1. The feedback circuit FC1 includes eight transistors M6 to M13, voltages VDD, V30, and V40, a reference current source IREF and a capacitor C10, which form another current mirror. In an embodiment, the feedback circuit FC1 corresponds to the feedback circuit FC1 of FIG. 1 and FIG. 2.

According to an exemplary embodiment, the feedback circuit FC1 is implemented as a classAB-stage current mirror with low quiescent current. According to an exemplary embodiment, the classAB-stage quiescent current is an order of magnitude below the static current flowing through the current source IS. Transistors M6 and M7 form a simple current mirror, while a reference current is being subtracted from the input current ICS1 by current source IREF. This first stage is followed by a second stage, comprising transistors M10 to M13. According to an exemplary embodiment, the second stage comprises a push-pull current mirror stage, where the ratio of PMOS transistors M10/M12 determines the gain for currents above the reference current (slope S2 in FIG. 3). Likewise, the ratio of NMOS transistors M11/M13 determines the gain for currents below the reference current (slope S1 in FIG. 3). Transistors M8 and M9 are used to control the classAB quiescent current, according to a Monticelli bias scheme. It should be noted that in a standard classAB stage, transistors M10 and M11 are omitted, which would result in higher gain, that is not well controlled (being determined by a gm*r0 product), making it impossible to stabilize the overall loop. Capacitor C10 may be optionally added to the feedback circuit to further improve stability of the feedback loop. Without this capacitor, there is an additional pole at the gate of transistor M12, which can be compensated by this bypass capacitor.

The feedback circuit FC1 according to the present description is capable of accurately controlling the (low) quiescent current while showing large current gain, without introducing extra poles that could destroy stability, increase dynamic current capability without sacrificing on static power consumption and presents good power efficiency in terms of high peak current vs. low quiescent current.

Figure 6:
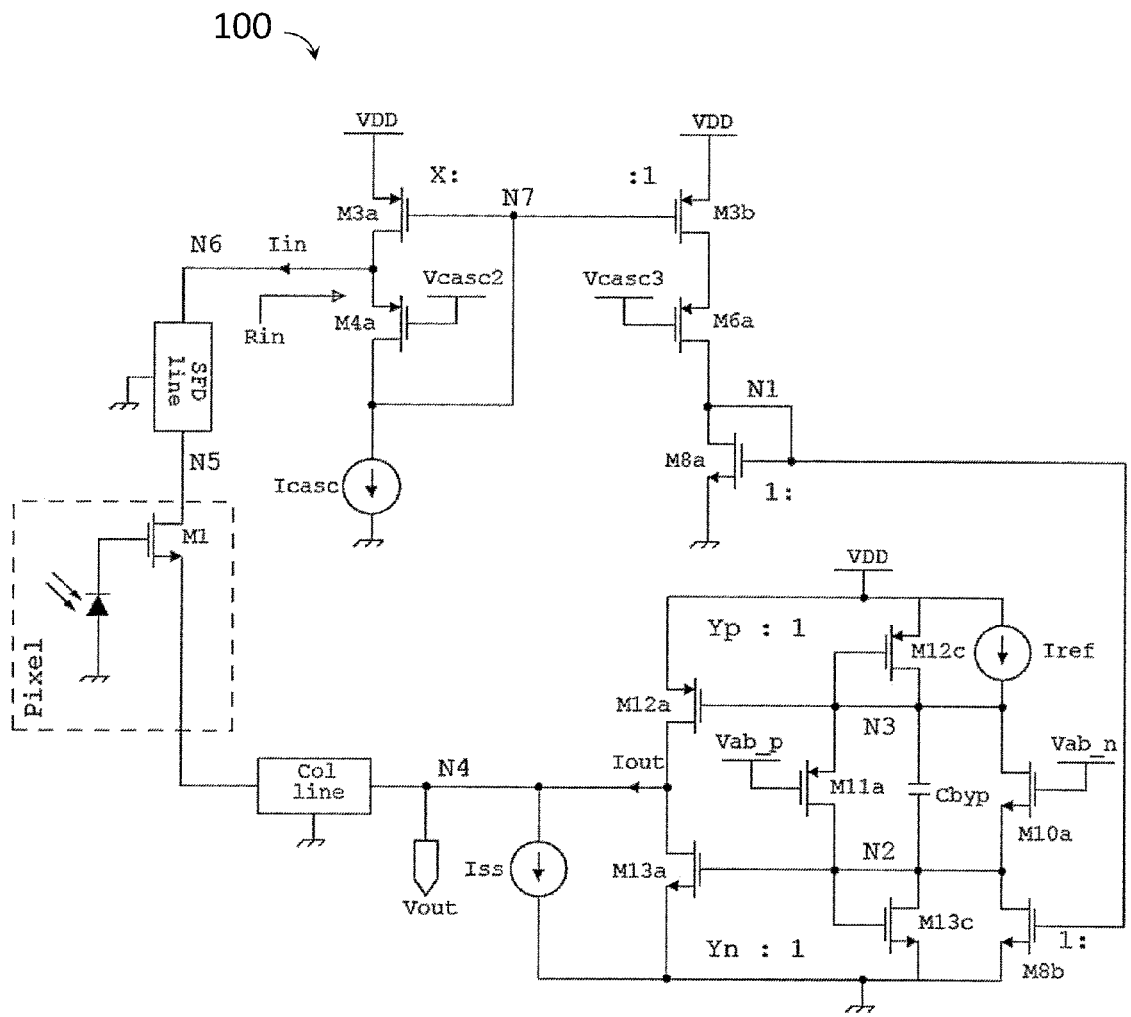
FIG. 6 is an exemplary implementation of an active pixel sensor imaging system.

FIG. 6 is a general exemplary implementation of an active pixel sensor imaging system 100, corresponding to the imaging system 100 of FIG. 1 and incorporating the circuits in FIG. 4 and FIG. 5. The system 100 includes an active pixel sensor circuit "Pixel" connected to a supply line "SFD line" and a column line "Col line." The system 100 includes transistors M1, M3a, M3b, M4a, M6a, M8a, M8b, M10a, M11a, M12a, M12c, M13a, and M13c. The system 100 includes current sources Iss, Icasc, and Iref. The system 100 includes a column line output voltage Vout, and input loop current Iin and output loop current Iout. The system 100 connection nodes N1 to N7. The system 100 includes a bypass capacitor Cbyp. The system 100 includes voltages Vdd, Vcasc2, Vcasc3, Vab_n, Vab_p. By combining the features of the circuits in FIG. 4 and FIG. 5, an overall loop with very stable low-frequency gain is obtained. This makes it feasible to stabilize the loop under the many different load conditions that can be presented by the column and supply line parasitics in a real image sensor circuit. At the same time, the circuit is power-efficient due to its classAB output stage that allows control of a low quiescent current.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. An active pixel sensor imaging system, comprising:
a plurality of active pixel sensor circuits arranged into an array of rows and columns, at least one of said active pixel sensor circuits being connected to a supply line and a column line and operable to generate a voltage output through the column line corresponding to a detected light intensity;
a current sensing circuit, located external to the plurality of active pixel sensor circuits and connected to the supply line, the current sensing circuit being implemented as a current mirror for sensing a current through an active pixel sensor circuit readout transistor; and
a feedback circuit, located external to the plurality of active pixel sensor circuits and connected to the column line, to a current generator and to the current sensing circuit, the feedback circuit being implemented as a classAB current mirror configured for controlled quiescent current.

2. The system of claim 1 wherein the feedback circuit is designed to present a different current gain for a rising and a falling slope of the column line output voltage.

3. The system of claim 1 wherein the feedback circuit is designed to have a transfer function with two linear segments, each having a different slope.

4. The system of claim 3 wherein an inflection point between the two linear segments is defined by a reference current generated within the feedback circuit.

5. The system of to claim 4, wherein the classAB current mirror comprises a push-pull current mirror stage where a ratio of a first pair of transistors determines a gain for currents above the reference current and a ratio of a second pair of transistors determines a gain for currents below the reference current.

6. The system of claim 5, wherein the first pair of transistors are PMOS transistors and the second pair of transistors are NMOS transistors.

7. The system of claim 1, wherein the classAB current mirror comprises a pair of transistors to control the quiescent current according to a Monticelli bias scheme.

8. The system of claim 7, wherein the classAB current mirror comprises a bypass capacitor connected between two gate voltage sources of a plurality of classAB stage transistors.

9. The system of claim 1, wherein the current sensing circuit is implemented as a low-swing current mirror designed to reduce its input impedance to the supply line at a first connection node.

10. The system of claim 8, wherein the impedance at the first connection node between the supply line and the current sensing circuit is designed to be lower than a second connection node between the feedback circuit and the column line, such as to obtain a non-dominant pole at the first connection node.

11. An electronic device comprising an active pixel sensor imaging system according to claim 1.

* * * * *